(12) United States Patent
Lee

(10) Patent No.: US 7,652,331 B2
(45) Date of Patent: Jan. 26, 2010

(54) SEMICONDUCTOR DEVICE AND METHOD FOR FABRICATING THE SAME

(75) Inventor: Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/822,650

(22) Filed: Jul. 9, 2007

(65) Prior Publication Data

US 2007/0284655 A1 Dec. 13, 2007

(51) Int. Cl.
*H01L 27/01* (2006.01)
*H01L 27/12* (2006.01)
*H01L 31/0392* (2006.01)

(52) U.S. Cl. .................. 257/347; 257/396; 257/510; 257/E21.32; 257/E21.245; 257/E21.249; 257/E21.231; 257/E21.546

(58) Field of Classification Search .................. 257/301, 257/347, 296, 396, 508, 510, 616, 622, 744
See application file for complete search history.

(56) References Cited

U.S. PATENT DOCUMENTS

| | | | |
|---|---|---|---|
| 5,089,428 A * | 2/1992 | Verret et al. ................ 438/312 |
| 5,166,084 A | 11/1992 | Pfiester | |
| 5,268,324 A * | 12/1993 | Aitken et al. ................ 438/217 |
| 5,422,305 A * | 6/1995 | Seabaugh et al. ........... 438/480 |
| 5,616,515 A * | 4/1997 | Okuno ....................... 438/478 |
| 6,352,942 B1 * | 3/2002 | Luan et al. ................... 438/770 |
| 6,429,061 B1 | 8/2002 | Rim | |
| 2005/0250294 A1 | 11/2005 | Ghyselen | |

FOREIGN PATENT DOCUMENTS

| | | |
|---|---|---|
| JP | 10-50820 A | 2/1998 |
| KR | 10/20010028838 A | 4/2001 |

OTHER PUBLICATIONS

Kyoung Hwan Yeo et al., "80 nm 512M DRAM with Enhanced Data Retention Time Using Partially-Insulated Cell Array Transistor (PiCAT)," IEEE, 2004 Symposium on VLSI Technlogy, Digest of Technical Papers, pp. 30-31.
Wolf, Silicon Processing for the VLSI Era vol. 2: Process Integration, 1990, pp. 39-41.

* cited by examiner

*Primary Examiner*—David Nhu
(74) *Attorney, Agent, or Firm*—Townsend and Townsend and Crew LLP

(57) ABSTRACT

A semiconductor device includes a device isolation structure formed on a semiconductor substrate to define an active region. A first Si-based epitaxial pattern is formed over the active region corresponding to a bit line contact region and a portion of a gate region at both sides adjacent to the bit line contact region. A second Si-based epitaxial layer is formed over the semiconductor substrate which is stepped up on the first Si-based epitaxial pattern. A stepped gate pattern is formed over the stepped second Si-based epitaxial layer.

5 Claims, 9 Drawing Sheets

(i) (ii)

(i) (ii)

SEMICONDUCTOR DEVICE AND METHOD FOR FABRICATING THE SAME

BACKGROUND OF THE INVENTION

1. Field of the Invention

The present invention generally relates to a method for fabricating a semiconductor device, and more specifically to a method for fabricating a semiconductor device wherein a gate is formed on a stepped Si epitaxial layer to increase an effective length of a gate channel, and an oxide film is only formed at the interface of the Si epitaxial layer and the semiconductor substrate where a bit line contact is to be formed, thereby improving a characteristic of a leakage current for a storage node junction.

2. Description of the Related Art

FIG. 1 is a layout illustrating a method for fabricating a semiconductor device, wherein reference numerals 1000a, 1, 2 and 3 denote a cell region, an active region, a first gate region and a second gate region, respectively. The first gate region 2 is overlapped the second gate region 3. A line width of the first gate region 2 is less than a width of the second gate region 3.

FIGS. 2a through 2f are cross-sectional views illustrating a method for fabricating a semiconductor device, wherein FIGS. 2a(i) through 2f(i) are cross-sectional views taken along the line I-I' in FIG. 1, and FIGS. 2a(ii) through 2f(ii) are cross-sectional views in a core/peripheral circuit region 1000b.

Referring to FIG. 2a, a stacked structure of a SiGe epitaxial layer (not shown), a first Si epitaxial layer (not shown), a first oxide film (not shown) and a first nitride film (not shown) is formed on a semiconductor substrate 10 having a cell region 1000a and a core/peripheral circuit region 1000b defined therein. Next, a first photoresist film (not shown) is deposited on the entire surface of the first nitride film (not shown) in the cell region 1000a and the core/peripheral circuit region 1000b. Thereafter, the first photoresist film (not shown) is exposed and developed to form a first photoresist film pattern (not shown) exposing the first gate region 2 of FIG. 1 and covering the entire core/peripheral circuit region 1000b. After that, the stacked structure is etched using the first photoresist film pattern as an etching mask to expose the semiconductor substrate 10 corresponding to the first gate region 2 and the entire core/peripheral circuit region 1000b. The first photoresist film pattern is then removed.

Referring FIG. 2b, a first nitride film pattern 19 and a first oxide film pattern 17 in the cell region 1000a are removed via a wet etching method. Next, a second Si expitaxial layer 25 is formed on the entire surface of the cell region 1000a and the core/peripheral circuit region 1000b.

Referring to FIG. 2c, a second oxide film 30 and a second nitride film 35 are formed on the second Si epitaxial layer 25 in the cell region 1000a and the core/peripheral circuit region 1000b. Next, a second photoresist film (not shown) is deposited on the entire surface of the second nitride film 35. The second photoresist film is then exposed and developed to form a second photoresist film pattern (not shown) defining the active region 1 of FIG. 1 in the cell region 1000a, and also an active region in the core/peripheral circuit region 1000b. Thereafter, the second nitride film 35, the second oxide film 30, the second Si epitaxial layer 25, the first Si epitaxial layer pattern 15, the SiGe epitaxial layer pattern 13 and a given thickness of the semiconductor substrate 10 are etched using the second photoresist film pattern as an etching mask to form a trench 40 in the cell region 1000a and the core/peripheral circuit region 1000b. After that, the second photoresist film pattern (not shown) is removed. The SiGe epitaxial layer pattern 13 is then etched through a sidewall of the trench 40 via a wet etching method to form a space 27 under the first Si epitaxial layer pattern 15.

Referring to FIG. 2d, a gap-filling insulating film 45 is formed on the entire surface to fill up the space 27 and the trench 40 in the cell region 1000a and to fill up the trench 40 in the core/peripheral circuit region 1000b. Next, the gap-filling insulating film 45 is polished until the second nitride film 35 is exposed. The gap-filling insulating film 45 serves as a device isolation structure. Thereafter, a given thickness of the gap-filling insulating film 45 in the trench 40 is etched. The second nitride film 35 is then removed via a wet etching method. After that, a well implant process and a channel implant process are performed so as to adjust impurity concentrations in the cell region 1000a and the core/peripheral circuit region 1000b.

Referring to FIG. 2e, the second oxide film 30 in the cell region 1000a and the core/peripheral circuit region 1000b is removed via a wet etching method to expose the second Si epitaxial layer 25. A gate oxide film 50 is then formed on the exposed second Si epitaxial layer 25. Next, gate conductive layers 60 and 70, and a hard mask insulating film 80 are formed on the gate oxide film 50 and the gap-filling insulating film 45 in the cell region 1000a and the core/peripheral circuit region 1000b.

Referring to FIG. 2f, a third photoresist film (not shown) is deposited on the hard mask insulating film 80 in the cell region 1000a and the core/peripheral circuit region 1000b. Thereafter, the third photoresist film (not shown) is exposed and developed to form a third photoresist film pattern defining the second gate region 3 of FIG. 1 and a gate region (not shown) in the core/peripheral circuit region 1000b. Specifically, the third photoresist film pattern exposes a bit line contact region and storage node contact regions in the cell region 1000a and covers a region where a gate is to be formed in the core/peripheral circuit region 1000b. Next, the hard mask insulating film 80 and the gate conductive layers 70 and 60 are etched using the third photoresist film pattern as an etching mask to respectively form a gate 90 in the cell region 1000a and the core/peripheral circuit region 1000b.

However, in accordance with the above-described method, the gate 90 is formed on a plane second Si epitaxial layer. As a result, a gate channel length is decreased as a design rule of the semiconductor device is reduced. Moreover, an oxide film is formed at the interface of the Si epitaxial layer and the semiconductor substrate where a storage node contact is to be formed. Accordingly, the leakage current for a storage node junction is highly depended upon an interface characteristic between the Si epitaxial layer and an oxide film. In addition, the SiGe epitaxial layer under the storage node contact is removed for forming a device isolation film. As a result, Ge in the SiGe epitaxial layer is diffused into the first Si epitaxial layer, the second Si epitaxial layer and the semiconductor substrate due to heat treatment processes prior to the formation of the device isolation film. Accordingly, the leakage current for the storage node junction is increased.

SUMMARY OF THE INVENTION

Embodiments of the invention are directed to a semiconductor device including a stepped gate. According to one embodiment of the invention, a stepped gate is formed over a stepped structure that is formed of a stacked structure of a Si epitaxial layer and an insulating film. As a result, a length of the gate channel is increased.

According to one embodiment of the invention, a semiconductor device includes: a device isolation structure formed on a semiconductor substrate to define an active region; a first Si-based epitaxial pattern formed over the active region corresponding to a bit line contact region and a portion of a gate region at both sides adjacent to the bit line contact region; a second Si-based epitaxial layer formed over the semiconductor substrate which is stepped up on the first Si-based epitaxial pattern; and a stepped gate pattern formed over the stepped second Si-based epitaxial layer.

According to another embodiment of the invention, a semiconductor device includes: a device isolation structure formed on a semiconductor substrate to define an active region; a first Si-based epitaxial pattern formed over the active region corresponding to a bit line contact region and a portion of a gate region at both sides adjacent to the bit line contact region; a second Si-based epitaxial layer formed over the semiconductor substrate; and a gate formed over the second Si-based epitaxial layer, wherein the semiconductor device is characterized in that the second Si-based epitaxial layer is formed to be stepped up on the first Si-based epitaxial pattern.

According to one embodiment of the invention, a method of fabricating a semiconductor device includes: forming a first Si-based epitaxial pattern over a semiconductor substrate corresponding to a bit line contact region and a portion of gate regions adjacent to the bit line contact region; forming a second Si-based epitaxial layer over the semiconductor substrate, wherein the second Si-based epitaxial layer is stepped up on the first Si-based epitaxial pattern; etching the second Si-based epitaxial layer, the first Si-based epitaxial pattern, and a portion of the semiconductor substrate by using a device isolation mask to form a trench defining an active region; removing a portion of the first Si-based epitaxial pattern through a sidewall of the trench to form an under-cut space; forming a device isolation structure to fill the under-cut space and the trench; forming a gate insulating film over the stepped second Si-based epitaxial layer; and forming a stepped gate pattern over the semiconductor substrate including the stepped second Si-based epitaxial layer.

According to another embodiment of the invention, a method of fabricating a semiconductor device includes: forming a first Si-based epitaxial pattern over a semiconductor substrate corresponding to a bit line contact region and a portion of gate regions adjacent to the bit line contact region; forming a second Si-based epitaxial layer over the semiconductor substrate; etching the second Si-based epitaxial layer, the first Si-based epitaxial pattern, and a portion of the semiconductor substrate by using a device isolation mask to form a trench defining an active region; removing a portion of the first Si-based epitaxial pattern through a sidewall of the trench to form an under-cut space; forming a device isolation structure to fill the under-cut space and the trench; forming a gate insulating film over the stepped second Si-based epitaxial layer; and forming a stepped gate pattern over the semiconductor substrate including the stepped second Si-based epitaxial layer, wherein the method is characterized in that the second Si-based epitaxial layer is stepped up on the first Si-based epitaxial pattern.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts.

Figure 1:
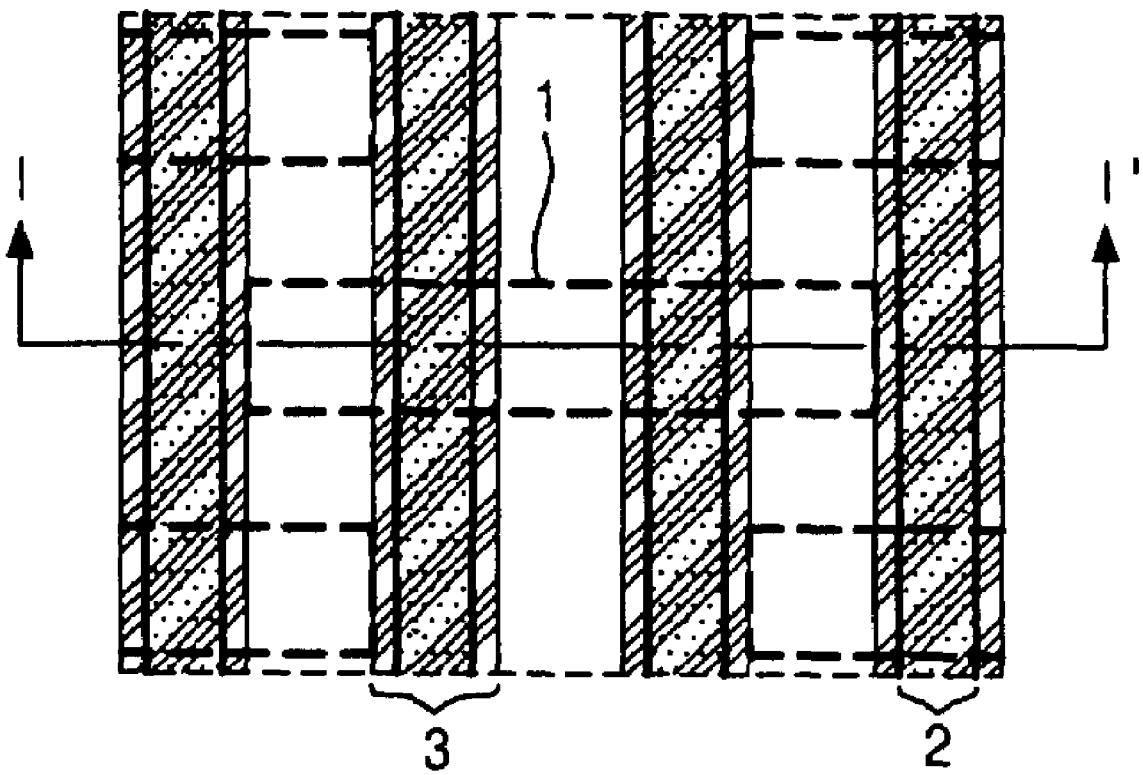
FIG. 1 is a layout illustrating a method for fabricating a semiconductor device.
Figure 2A:
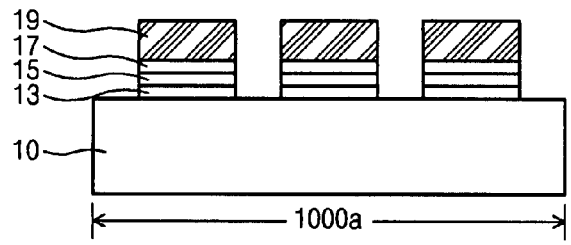
FIGS. 2a through 2f are cross-sectional views illustrating a method for fabricating a semiconductor device.
Figure 2A:
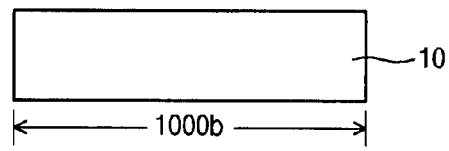
Figure 2B:
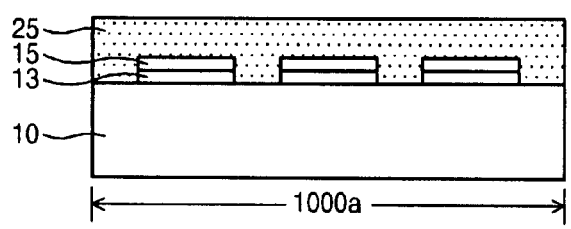
Figure 2B:
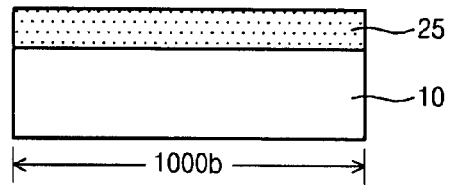
Figure 2C:
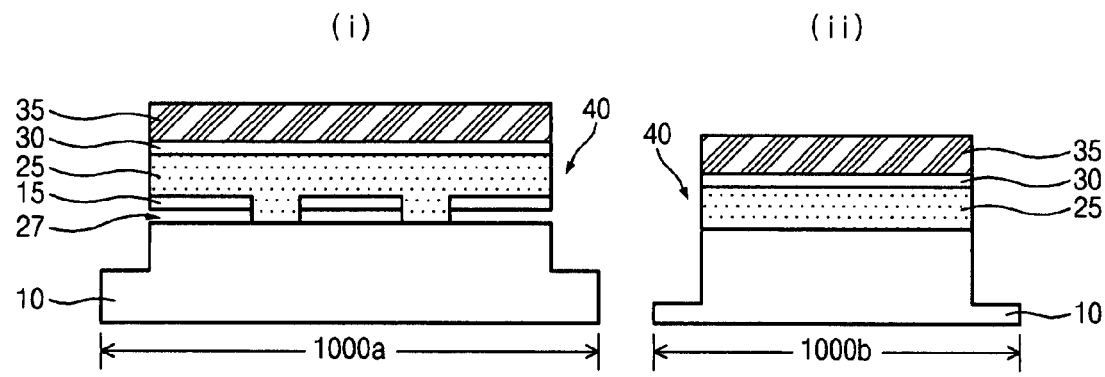
Figure 2D:
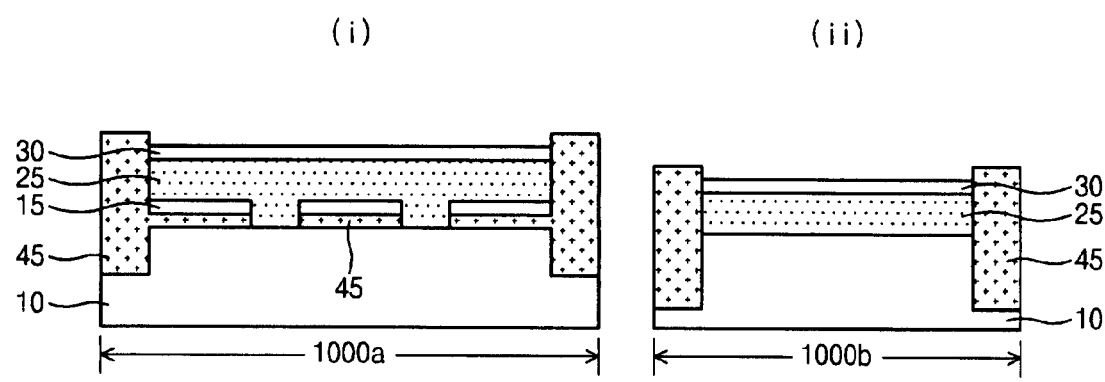
Figure 2E:
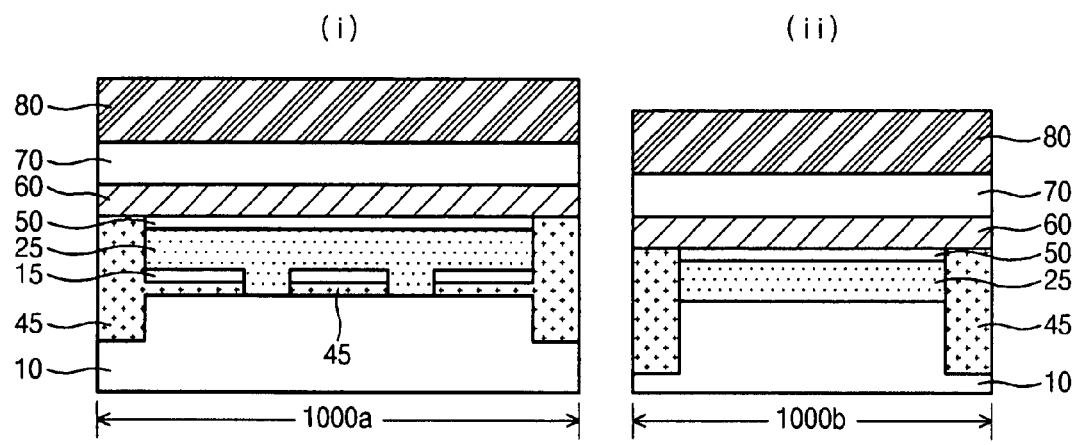
Figure 2F:
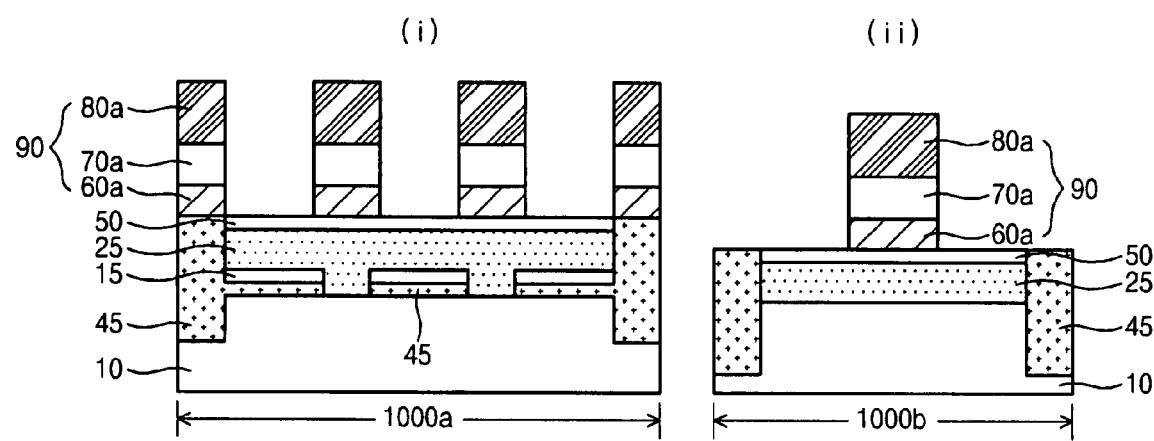
Figure 3:
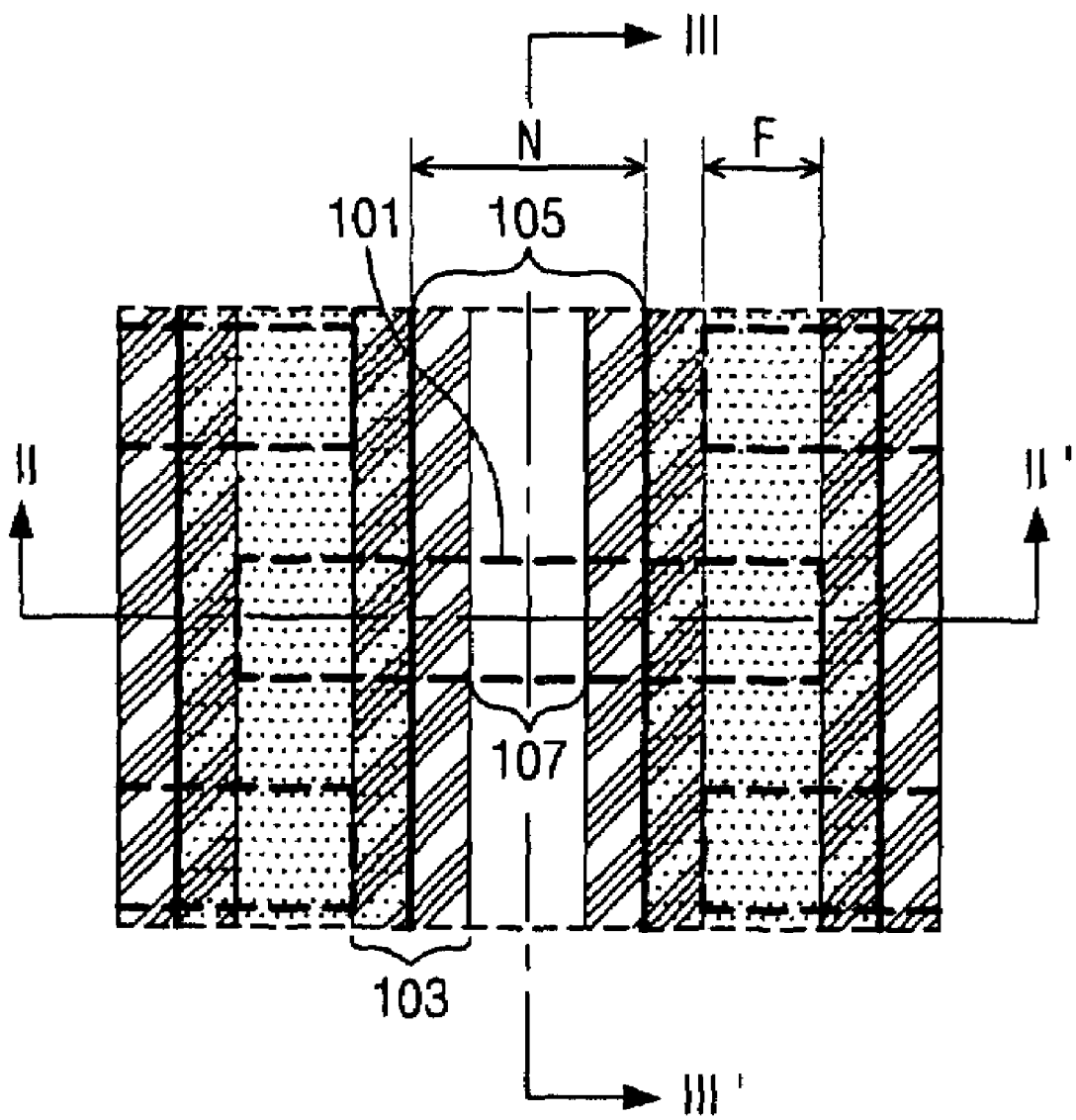
FIG. 3 is a layout illustrating a method for fabricating a semiconductor device in accordance with an embodiment of the present invention.

FIG. 3 is a layout illustrating a method for fabricating a semiconductor device in accordance with an embodiment of the present invention, wherein reference numerals 2000a, 101, 103, 105, and 107 denote a cell region, an active region, a gate region, a step region, and a bit line contact region, respectively. The step region 105 includes a bit line contact region 107 and a portion of a gate region 103 at both sides adjacent to the bit line contact region 107. A line width of the step region 105 is N, where $F<N\leq7/3F$, and F is a distance between two neighboring gate regions 103.

Figure 4A:
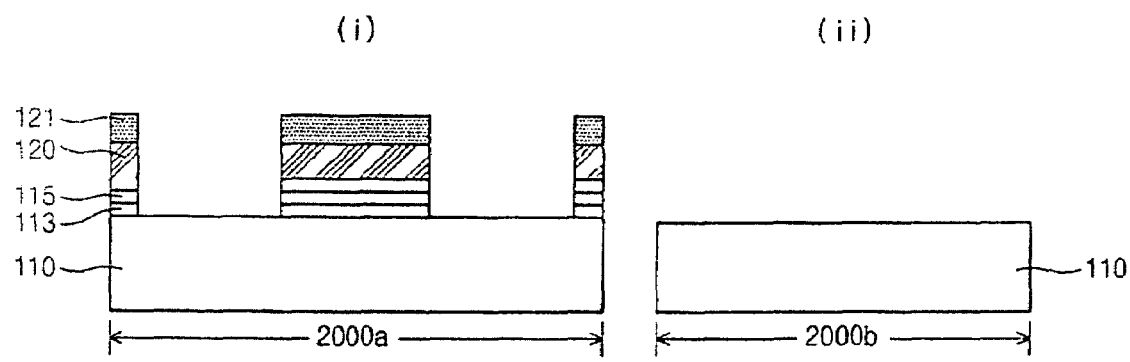
FIGS. 4a through 4f and FIG. 5 are cross-sectional views illustrating a method for fabricating a semiconductor device according to an embodiment of the present invention.

FIGS. 4a through 4f illustrate a method for fabricating a semiconductor device according to an embodiment of the present invention, wherein FIGS. 4a(i) through 4f(i) are cross-sectional views taken along the line II-II' of FIG. 3, and FIGS. 4a(ii) through 4f(ii) are cross-sectional views in a core/peripheral circuit region 2000b.

Referring to FIG. 4a, a stacked structure of a SiGe epitaxial layer (not shown), a first Si-based epitaxial layer (not shown) and an insulating film (not shown) is formed over a semiconductor substrate 110 having a cell region 2000a and a core/peripheral circuit region 2000b defined therein. Preferably, the insulating film comprises an oxide film or a stacked structure of an oxide film and a nitride film. Next, a first photoresist film (not shown) is deposited over the entire surface of the insulating film in the cell region 2000a and the core/peripheral circuit region 2000b. Thereafter, the first photoresist film (not shown) is exposed and developed to form a first photoresist pattern 121 covering the step region 105 of FIG. 3 and exposing the entire core/peripheral circuit region 2000b. The step region 105 includes a bit line contact region 107 and a portion of the gate region 103 at both sides adjacent to the bit line contact region 107. Preferably, a line width of the step region 105 is N, where $F<N\leq7/3F$, and F is a distance between two neighboring gate regions 103. After that, the stacked structure is etched using the first photoresist pattern 121 as an etching mask to expose the semiconductor substrate 110 where a storage node contact region and a portion of the gate region 103 at both sides adjacent to the storage node contact region and the entire core/peripheral circuit region 2000b. An insulating film pattern 120, a first Si-based epitaxial pattern 115, and a SiGe epitaxial pattern 113 are formed over the step region. The first photoresist film pattern 121 is then removed. In one embodiment of the present invention, the Si-based epitaxial layer is formed with Si. In addition, the Si-based epitaxial layer may be formed with Si and additions such as Ge.

Figure 4B:
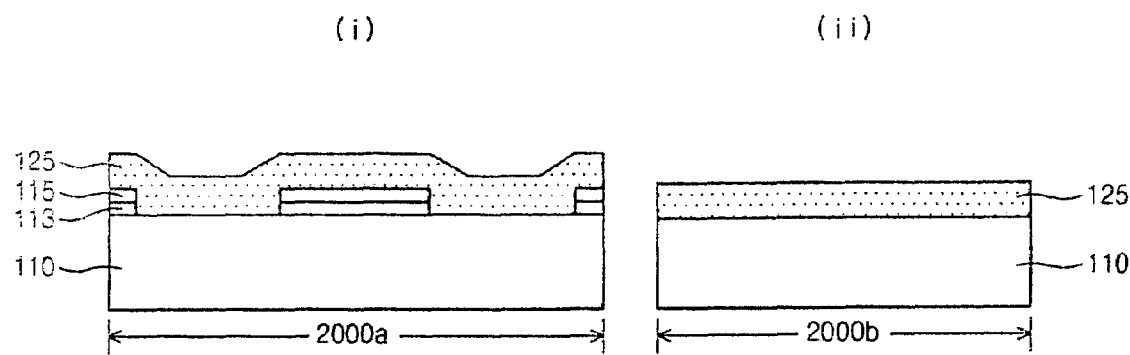

Referring to FIG. 4b, the insulating film pattern 120 in the cell region 2000a is removed. Preferably, the process of removing the insulating film pattern 120 is performed by a wet etching method. Next, a stepped second Si epitaxial layer 125 is formed over the semiconductor substrate in the cell region 2000a and the core/peripheral circuit region 2000b. Preferably, a thickness of the second Si-based epitaxial layer 125 is in a range of about 10~100 nm. The second Si-based epitaxial layer 125 in the cell region 2000a has a step difference since the second Si-based epitaxial layer 125 in the cell region 2000a is stepped up on a stacked structure of the first Si-based epitaxial pattern 115 and the SiGe epitaxial pattern 113.

Figure 4C:
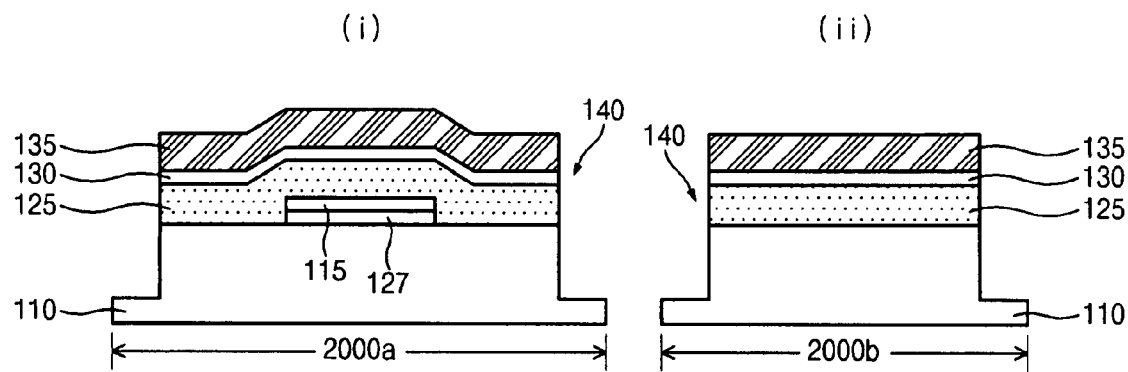

Referring to FIG. 4c, a second oxide film 130 and a second nitride film 135 are formed over the stepped second Si-based epitaxial layer 125 in the cell region 2000a and the core/peripheral circuit region 2000b. Next, a second photoresist film (not shown) is deposited over the entire surface of the second nitride film 135. The photoresist film is then exposed and developed to form a second photoresist pattern (not shown) to define the active region 101 of FIG. 3 in the cell region 2000a and also an active region in the core/peripheral circuit region 2000b. Thereafter, the second nitride film 135, the second oxide film 130, the second Si-based epitaxial layer 125, the first Si-based epitaxial pattern 115, the SiGe epitaxial pattern 113 and a portion of the semiconductor substrate 110 are etched using the second photoresist pattern as an etching mask to form a trench 140 in the cell region 2000a and the core/peripheral circuit region 2000b. After that, the second photoresist pattern is removed. The SiGe epitaxial pattern 113 is then etched through a sidewall of the trench 140 to form an under-cut space 127 under the first Si-based epitaxial layer pattern 115.

Figure 5:
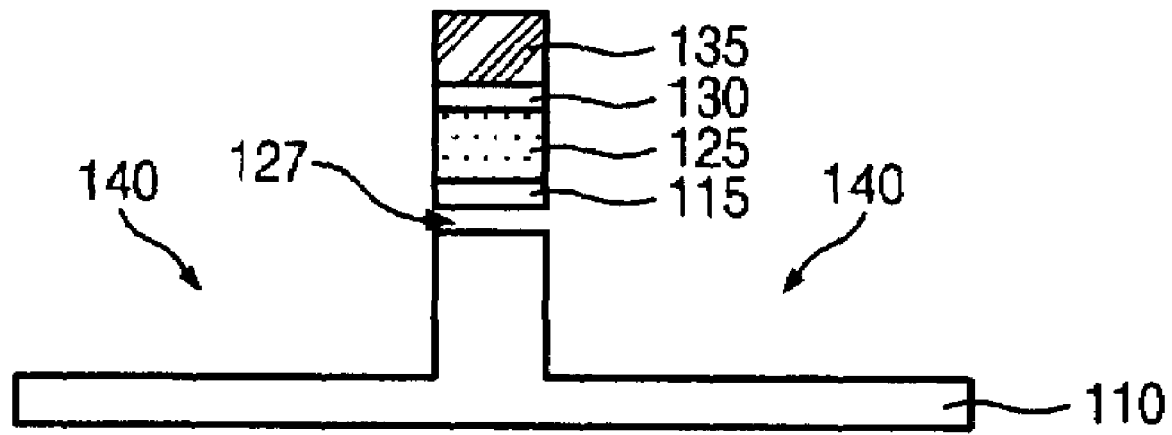

FIG. 5 is a cross-sectional view taken along the line III-III' of FIG. 3 illustrating the structure of FIG. 4c(i) including the space 127 having an under-cut structure.

Preferably, the process of removing the SiGe epitaxial pattern 113 is preformed by a wet etching method, a plasma etching method, and a combination thereof. The wet etching method utilizes a mixed etchant containing HF, $H_2O_2$ and $CH_3CHOOH$. The plasma etching method utilizes a mixed gas containing ($CF_3$ or $CH_2F_2$), $N_2$ and $O_2$, and combinations thereof. Moreover, a volume ratio of HF, $H_2O_2$ and $CH_3COOH$ in the mixed etchant is preferably about 1:2:3.

Figure 4D:
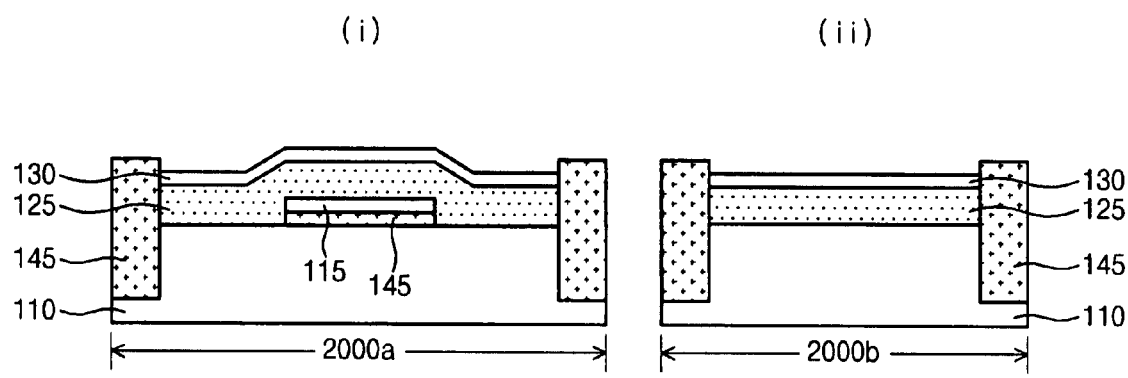

Referring to FIG. 4d, a gap-filling insulating film 145 is formed over the entire surface to at least fill up the under-cut space 127 and the trench 140 in the cell region 2000a and to fill up the trench 140 in the core/peripheral circuit region 2000b. Preferably, the process of forming the gap-filling insulating film 145 may include forming a thermal oxide film to fill the under-cut space 127 and forming an oxide film for device isolation to fill the trench 140. A nitride film may be further formed at an interface of the thermal oxide film and the oxide film for device isolation. Moreover, the process of forming the gap-filling insulating film 145 may include forming a thermal oxide film to fill up a portion of the under-cut space 127, forming a nitride film to fill up the remaining portion of the under-cut space 127, and forming an oxide film for device isolation to fill up the trench 140. Next, the gap-filling insulating film 145 is polished until the second nitride film 135 is exposed. The gap-filling insulating film 145 in the trench 140 serves as a device isolation structure. Thereafter, a portion of the gap-filling insulating film 145 in the trench 140 is etched. The second nitride film 135 is then removed. Preferably, the process of etching the gap-fill insulating film 145 is performed by a wet etching method. The process of removing the second nitride film 135 is preferably preformed by a wet etching method. After that, well implant and channel implant processes are performed so as to respectively adjust impurity concentrations in the cell region 2000a and the core/peripheral circuit region 2000b.

Figure 4E:
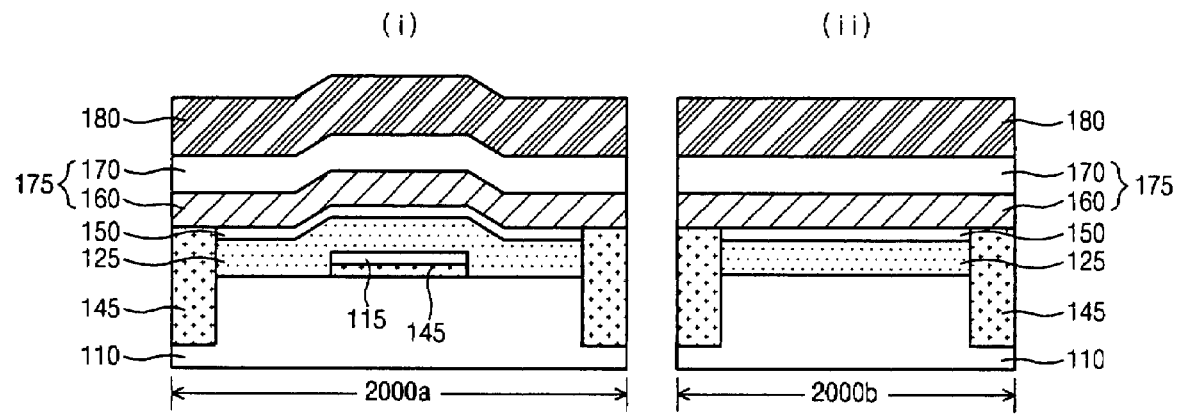

Referring to FIG. 4e, the second oxide film 130 in the cell region 2000a and the core/peripheral circuit region 2000b is removed to expose the stepped second Si-based epitaxial layer 125. A gate oxide film 150 is then formed over the stepped second Si-based epitaxial layer 125. Preferably, the process of etching the second oxide film 130 is performed by a wet etching method. Next, a stacked structure of a gate conductive layer 175 and a gate hard mask layer 180 is formed over the gate oxide film 150 and the gap-filling insulating film 145 in the cell region 2000a and the core/peripheral circuit region 2000b. Preferably, the gate conductive layer 175 comprises a lower conductive layer 160 and an upper conductive layer 170.

Figure 4F:
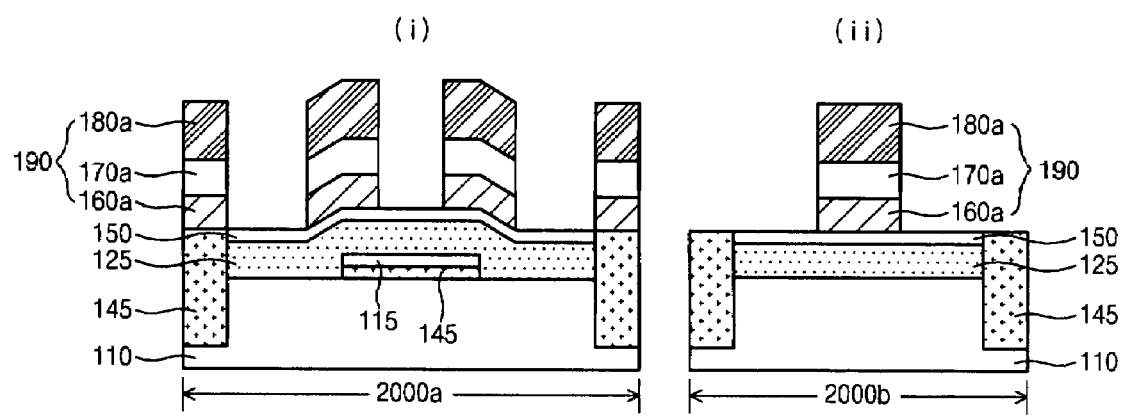

Referring to FIG. 4f, a third photoresist film (not shown) is deposited over the gate hard mask layer 180 in the cell region 2000a and the core/peripheral circuit region 2000b. Thereafter, the third photoresist film (not shown) is exposed and developed to form a third photoresist pattern to define the gate region 103 of FIG. 3 and a gate region in the core/peripheral circuit region 2000b. Specifically, the third photoresist pattern exposes a bit line contact region 107 and storage node contact regions in the cell region 2000a and covers a region where a gate is to be formed in the core/peripheral circuit region 2000b. Next, the stacked structure is patterned using the third photoresist pattern as an etching mask to respectively form a stepped gate 190 in the cell region 2000a and a gate in the core/peripheral circuit region 2000b. Thus, the gap-filling insulating film 145 is disposed only in the bit line contact region 107 of FIG. 3 and a portion under the stepped gate 190 adjacent to the bit line contact region 107. In addition, subsequent processes such as an ion-implant process for forming source/drain regions in the active regions, a process for forming a spacer on a sidewall of the gate 190, a process for forming a landing plug, a process for forming a bit line contact and a bit line, a process for forming a capacitor and a process for forming an interconnect may be done.

As described above, the method for fabricating a semiconductor device in accordance with the present invention provides exposing the contact region including the storage node contact region and a portion of the gate region adjacent thereto and only forming an oxide film at the interface of the Si epitaxial layer under both a bit line contact region and a portion of a gate region at both sides adjacent to the bit line contact region and the underlying semiconductor substrate. Accordingly, capacitance for a bit line contact and a short-channel effect of a cell transistor are improved.

As shown in FIG. 4f, the gate 190 in the cell region 2000a is formed over a stepped structure instead of over a plane structure to increase an effective length of the gate channel. The storage node contact is formed over the Si epitaxial layer without the oxide film to minimize the leakage current of the storage node junction. Accordingly, a refresh characteristic of a DRAM can be improved.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:
1. A semiconductor device, comprising:
   a device isolation structure formed on a semiconductor substrate to define an active region;

a first Si-based epitaxial pattern formed over the active region corresponding to a bit line contact region and a portion of a gate region at both sides adjacent to the bit line contact region;

a second Si-based epitaxial layer formed over the semiconductor substrate and the first Si-based epitaxial pattern, wherein a first surface of the second Si-based epitaxial layer formed above the first Si-based epitaxial pattern is higher than a second surface of the second Si-based epitaxial layer formed above the semiconductor substrate, a third surface of the second Si-based epitaxial layer between the first and second surfaces of the second Si-based epitaxial layer being sloped; and a gate pattern formed over the sloped third surface of the second Si-based epitaxial layer.

2. The semiconductor device of claim 1, wherein a line width of the first Si-based epitaxial pattern is N, where $F<N\leq7/3\ F$, and F is a distance between two neighboring gate regions.

3. The semiconductor device of claim 1, further comprising an insulating film pattern disposed between the first Si-based epitaxial pattern and the semiconductor substrate.

4. A semiconductor device comprising:

a device isolation structure formed on a semiconductor substrate to define an active region;

a first Si-based epitaxial pattern formed over the active region corresponding to a bit line contact region and a portion of a gate region at both sides adjacent to the bit line contact region;

a second Si-based epitaxial layer formed over the semiconductor substrate and the first Si-based epitaxial pattern, wherein a first surface of the second Si-based epitaxial layer formed above the first Si-based epitaxial pattern is higher than a second surface of the second Si-based epitaxial layer formed above the semiconductor substrate, the first and second surfaces of the second Si-based epitaxial layer being substantially parallel to a surface of the semiconductor substrate, and a third surface of the second Si-based epitaxial layer between the first and second surfaces of the second Si-based epitaxial layer being sloped relative to the first and second surfaces of the second Si-based epitaxial layer; and a gate formed over the sloped third surface of the second Si-based epitaxial layer.

5. The semiconductor device according to claim 4, further comprising an insulating film disposed between the first Si-based epitaxial pattern and the semiconductor substrate.

* * * * *